United States Patent
Cook

(10) Patent No.: US 10,964,034 B1
(45) Date of Patent: Mar. 30, 2021

(54) VERTICAL DISPARITY DETECTION IN STEREOSCOPIC IMAGES FROM OPTICAL FLOW DATA

(71) Applicant: Nvidia Corporation, Santa Clara, CA (US)

(72) Inventor: David Cook, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 16/668,123

(22) Filed: Oct. 30, 2019

(51) Int. Cl.
*G06T 7/30* (2017.01)
*G06T 7/20* (2017.01)

(52) U.S. Cl.
CPC .............. *G06T 7/30* (2017.01); *G06T 7/20* (2013.01); *G06T 2207/20081* (2013.01); *G06T 2207/20228* (2013.01)

(58) Field of Classification Search
None
See application file for complete search history.

(56) References Cited

U.S. PATENT DOCUMENTS

| | | | |
|---|---|---|---|
| 2007/0165942 A1* | 7/2007 | Jin | H04N 13/20 382/154 |
| 2012/0314027 A1* | 12/2012 | Tian | H04N 19/172 348/43 |
| 2013/0208976 A1* | 8/2013 | Cook | H04N 13/10 382/154 |
| 2017/0091894 A1* | 3/2017 | Eldar | G06T 1/20 |
| 2017/0201736 A1* | 7/2017 | Ishimaru | H04N 13/243 |
| 2017/0359561 A1* | 12/2017 | Vallespi-Gonzalez | H04N 13/128 |
| 2019/0045168 A1* | 2/2019 | Chaudhuri | H04N 5/23232 |
| 2019/0158813 A1* | 5/2019 | Rowell | H04N 13/189 |
| 2020/0193609 A1* | 6/2020 | Dharur | G06N 3/0472 |

OTHER PUBLICATIONS

Luis E. Gurrieri and Eric Dubois, "Optimum Alignment of Panoramic Images for Stereoscopic Navigation in Image-Based Telepresence Systems", 2011, IEEE (Year: 2011).*

* cited by examiner

*Primary Examiner* — YuJang Tswei

(57) ABSTRACT

Due to the factors such as lens distortion and camera misalignment, stereoscopic image pairs often contain vertical disparities. Introduced herein is a method and apparatus that determine and correct vertical disparities in stereoscopic image pairs using an optical flow map. Instead of discarding vertical motion vectors of the optical flow map, the introduced concept extracts and analyzes the vertical motion vectors from the optical flow map and vertically aligns the images using the vertical disparity determined from the vertical motion vectors. The introduced concept recognizes that although not apparent, vertical motion does exist in stereoscopic images and can be used to correct the vertical disparity in stereoscopic images.

16 Claims, 3 Drawing Sheets

VERTICAL DISPARITY DETECTION IN STEREOSCOPIC IMAGES FROM OPTICAL FLOW DATA

TECHNICAL FIELD

This application is directed, in general, to three-dimensional images and displays and, more specifically, to a method and apparatus for processing and displaying stereoscopic images.

BACKGROUND

Stereoscopy presents an illusion of 3D depth from images on a two-dimensional (2D) plane. To create such an illusion, two slightly offset, stereoscopic images are presented separately to the left and right eye of a viewer. Stereoscopic images can enhance a viewing experience, providing greater impact, immersion, and realism compared to traditional two-dimensional images.

SUMMARY

In one aspect, a method for displaying a pair of stereoscopic images is provided. The method includes: generating an optical flow map of the pair of stereoscopic images, the optical flow map including one or more vertical motion vectors; determining a vertical disparity between the pair of stereoscopic images based on the one or more vertical motion vectors; and based on the vertical disparity, vertically aligning the pair of stereoscopic images to produce a vertically aligned pair of stereoscopic images.

In another aspect, a system for displaying a pair of stereoscopic images is provided. The system includes: an interface to receive a pair of stereoscopic images from an image source; and a processor to: generate an optical flow map based on the pair of stereoscopic images using a deep neural network (DNN), the optical flow map including one or more vertical motion vectors; determine a vertical disparity between the pair of stereoscopic images based on the one or more vertical motion vectors of the optical flow map; and vertically align the pair of stereoscopic images based on the vertical disparity to produce a vertically aligned pair of stereoscopic images.

In yet another aspect, a computer program product having a series of instructions stored on a non-transitory computer-readable medium that configures a processor, when executed thereby, to perform operations is provided. The operations include: generating an optical flow map of based on a pair of stereoscopic images, the optical flow map including one or more vertical motion vectors; determining a vertical disparity between the pair of stereoscopic images based on the one or more vertical motion vectors; and based on the vertical disparity, vertically aligning the pair of stereoscopic images to produce a vertically aligned pair of stereoscopic images.

BRIEF DESCRIPTION

Reference is now made to the following descriptions taken in conjunction with the accompanying drawings, in which.

DETAILED DESCRIPTION

Due to the factors such as lens distortion and camera misalignment, stereoscopic image pairs often contain vertical disparities. As the vertical disparity forces the eyes to move up and down independently of each other, it strains the viewer's eyes and renders stereoscopic image viewing experience unenjoyable.

Conventionally, the vertical disparity in a stereoscopic image pair has been addressed by identifying and correcting regions of the images with vertical disparities based on a region-by-region comparison of the images. The correcting process requires a preprocessing step that photographs a grid and determines the misalignment from the photographed grid. As the preprocessing step must be repeated periodically or whenever the camera setup is moved, this correcting process has been considered redundant and wasteful. Moreover, due to its coarseness, this approach also has been found to be inaccurate and imprecise. While finer comparisons, e.g., pixel-by-pixel, have been suggested, they have been found to be too computationally intensive and hence slow for real-time or near real-time application.

Introduced herein is a method and apparatus that determine and correct vertical disparities in stereoscopic image pairs using an optical flow map. An optical flow map is the pattern of apparent motion of objects, surfaces, and edges in a visual scene caused by the relative motion between an observer and a scene. As no vertical motion is apparent in stereoscopic images, vertical motion vectors in an optical flow map are typically discarded when generating a disparity map for stereoscopic images. Instead of discarding vertical motion vectors, the introduced concept extracts and analyzes the vertical motion vectors from the optical flow map and vertically aligns the images using the vertical disparity determined from the vertical motion vectors. The introduced concept recognizes that although not apparent, vertical motion does exist in stereoscopic images and can be used to correct the vertical disparity in stereoscopic images. As the introduced concept requires no preprocessing, it can be carried out post-production or at actual viewing time.

In one embodiment, the introduced concept compares locations of corresponding pixels, determines a vertical disparity between the images, and uses the determined vertical disparity to correct the vertical misalignment between the images. As the images are compared and analyzed at pixel to pixel level, the introduced concept determines and corrects the vertical disparity more accurately and precisely than the conventional coarse methods. Moreover, as the optical flow map may be generated and analyzed using a deep neural network (DNN), the introduced concept can maintain its accuracy and precision while still being fast enough to be implemented near real-time, if not in real-time, with displaying of the images.

Figure 1:
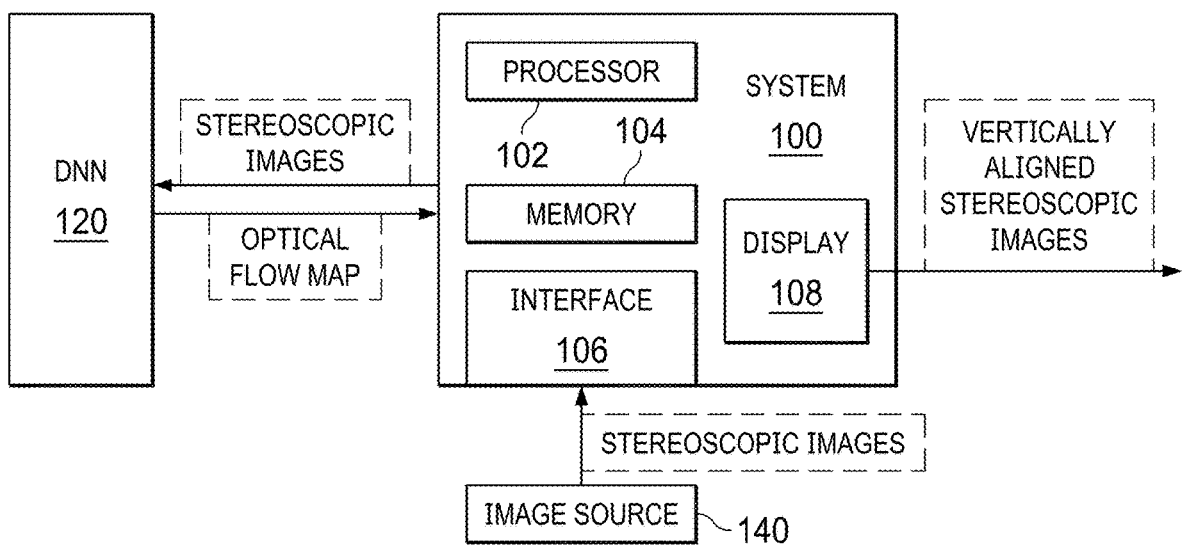
FIG. 1 is a block diagram of an embodiment of a system for displaying a pair of stereoscopic images implemented according to the principles of the disclosure.

FIG. 1 illustrates a block diagram of an embodiment of a system 100 for displaying a pair of stereoscopic images. The system 100 may be a stereoscopic image viewing device, such as 3D Vision® products from NVIDIA Corporation of Santa Clara, Calif., or a wearable device such as a Virtual Reality (VR) device.

In the illustrated embodiment, the system 100 is coupled to a DNN 120 and an image source 140. The DNN 120 may be implemented as a separate system as illustrated in FIG. 1. The DNN 120 may also be integrated as a part of the system 100. When implemented separately, the DNN 120 may be located remotely from the system 100, such as in a remote data processing server. The DNN 120 is trained to receive a pair of stereoscopic images as an input and provide an optical flow map of the pair of images to the system 100 as an output. The optical flow map is generated by comparing locations of corresponding features within the stereoscopic images. The pair of stereoscopic images includes a right eye view image and a left eye view image of a scene. The images may be photographic images that have been captured using digital cameras, or rendered images that have been generated by computers using computer programs. The resolution of the generated optical flow map may be the same as or substantially equivalent to that of the pair of images.

In the illustrated embodiment, the image source 140 is configured to create a pair of stereoscopic images and provide them to the system 100 for processing and display. The image source 140 may be a computing system that generates the images using computer programs or a digital camera apparatus that captures a scene as the images. In the illustrated embodiment, the system 100 includes a processor 102, a memory 104, an interface 106, and a display 108. The processor 102 is a general or special purpose processor, such as a graphics processing unit (GPU) or central processing unit (CPU), that is configured to generate an optical flow map of the pair using the DNN 120, determine a vertical disparity between the pair based on vertical motion vectors of the optical flow map, and vertically align the pair of images based on the vertical disparity. The vertically aligned stereoscopic images can then be provided to the display 108 for viewing.

To determine the vertical disparity between the stereoscopic image pair, the processor 102 extracts the vertical motion vectors from the optical flow map. Values of the vertical motion vectors may be directly obtained from the optical flow map or from a vertical disparity map that is extracted from the optical flow map. The vertical disparity map is a graphical representation of the vertical motion vectors extracted from the optical flow map. It is understood that the processor 102 may generate the vertical disparity map from the optical flow map or may use the DNN 120 to generate one. The vertical motion vectors may also be obtained by eliminating or extracting out horizontal motion vectors or a horizontal disparity map from the optical flow map.

To vertically align the images, the processor 102 adjusts corresponding features of the images based on the vertical disparity. More specifically, the processor 102 adjusts the corresponding features by moving pixels of the corresponding features in the images up or down based on the vertical disparity. The corresponding features may also be moved based on a pattern of the disparity when characteristics of the pattern (e.g., a misalignment, a direction, an offset, etc.) over a whole image or successive images can be identified. Characteristics of a disparity pattern can also be identified based on a source, e.g., a particular camera set-up or rig.

In the illustrated embodiment, the memory 104 is a non-transitory computer-readable medium that is configured to store various data. The memory 104 may store one or more of the received stereoscopic images, disparity maps, and optical flow map. The memory 104 may also store a series of instructions that when executed, configures the processor 102 to perform the functions that have been described above.

The interface 106 is configured to receive a pair of stereoscopic images from an image source 140. The interface 106 may be a conventional interface, e.g., a network interface card, that may be used for receiving image data from a camera or a renderer. The display 108 is configured to receive and provide vertically aligned stereoscopic images for viewing. The display 108 can be a conventional display device, such as employed with a stereoscopic image viewing device. The processor 102, memory 104, interface 106, and display 108 can be integrated in a single device. One or more of the components of the system 100 can also be located in different devices. For example, the display 108 can be a separate device that receives the vertically aligned stereoscopic images through a wired or wireless connection. Although not shown, the system 100 may include other conventional components of a stereoscopic image viewing device or wearable device.

Figure 2:
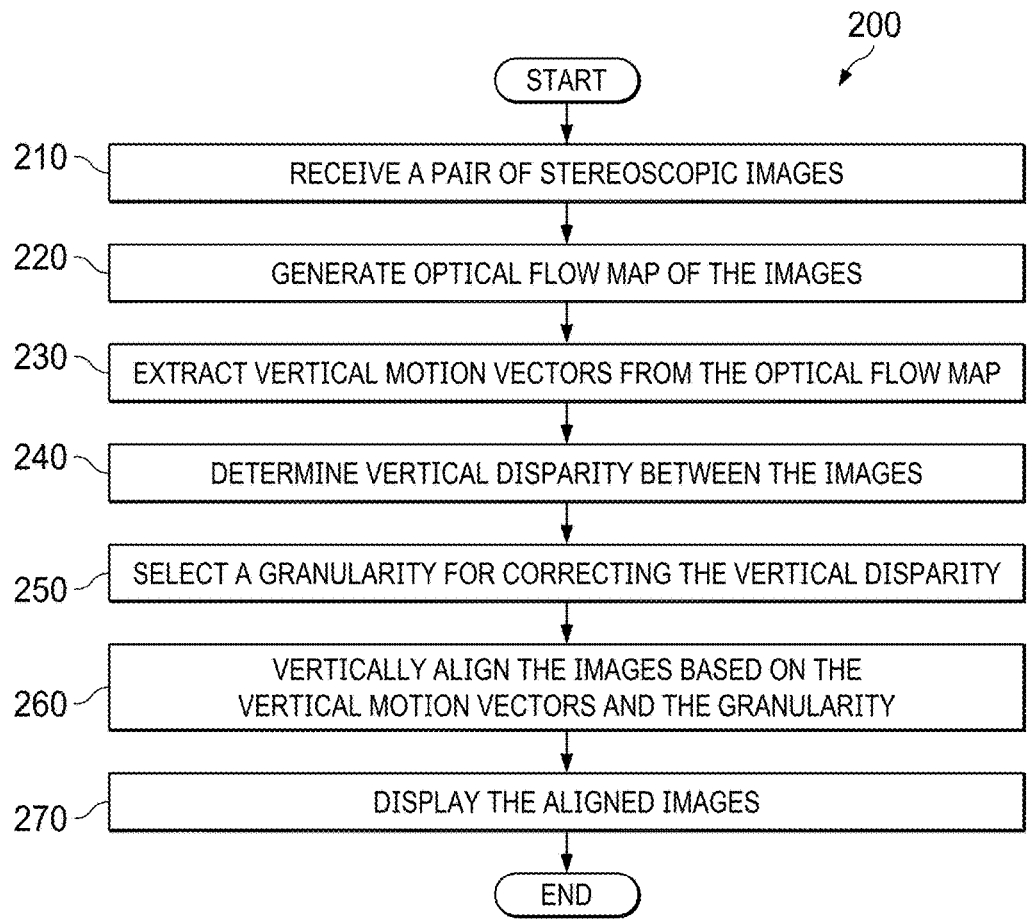
FIG. 2 is a flow diagram of an embodiment of a method for displaying a pair of stereoscopic images performed according to the principles of the disclosure.
Figure 3A:
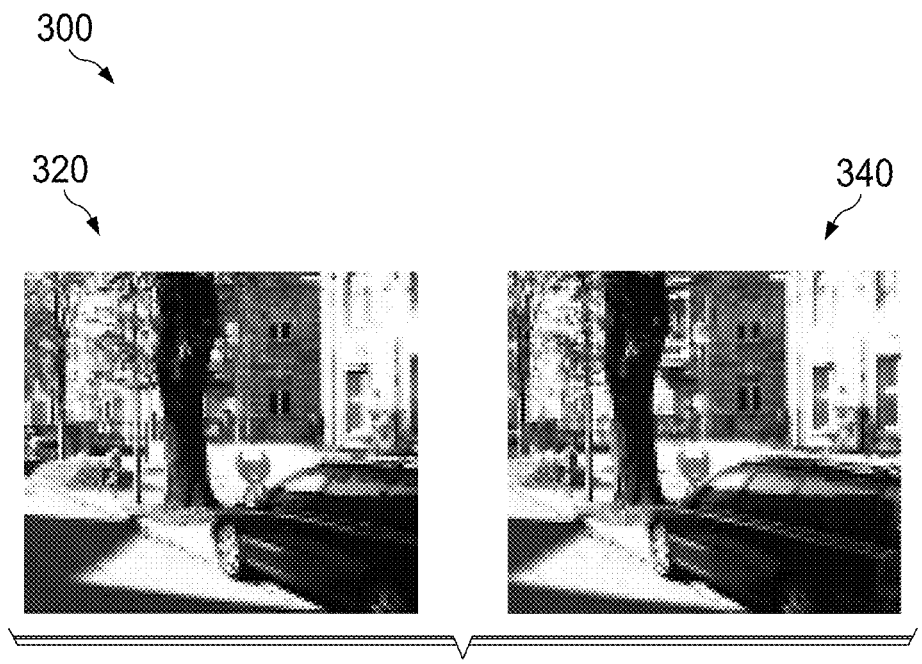
FIGS. 3A and 3B illustrate exemplary stereoscopic images and an optical flow map of the exemplary stereoscopic images, respectively.

FIG. 2 illustrates a flow diagram of an embodiment of a method 200 for displaying a pair of stereoscopic images. The method 200 may be performed using a processor, such as the processor 102 in FIG. 1. A series of instructions that when executed, configures the processor to perform the method 200 may be stored in a non-transitory computer readable medium, such as the memory 104 in FIG. 1. The method 200 starts at step 210, when a pair of stereoscopic images including a right eye view image and a left eye view image is received. The pair of images may be received from an image source, such as image source 140 in FIG. 1. A pair of exemplary stereoscopic images 300 that have been captured using a camera set is illustrated in FIG. 3A. The illustrated images 300 are photographic images that show a side of a car parked in a street near a tree. The illustrated images 300 include a left eye view image 320 of the scene and a right eye view image of the scene 340.

At step 220, an optical flow map of the pair of images is generated. In the illustrated embodiment, the optical flow map is generated by comparing locations of pixels for common/corresponding objects or features in the stereoscopic images. The step 220 may be performed by a processor in the system, such as 102 in FIG. 1, employing a DNN, such as DNN 120 in FIG. 1.

The DNN used for step 220 has been trained to produce an optical flow map from input stereoscopic images. The DNN may be trained using a supervised learning method, e.g., by feeding the DNN with stereoscopic image pairs and the expected optical flow maps for the image pairs. Once fully trained, the DNN can be implemented as a component, e.g., a dynamic-link library, of a software package that causes the processor to perform the method 200. By using a fully trained DNN, the method 200 can significantly shorten the time required to perform step 220, which would typically be the step requiring the greatest length of time to complete had the method 200 been performed according to ordinary approaches that do not use a DNN.

Referring back to FIG. 3, FIG. 3B illustrates an example of an optical flow map 360 that has been generated using the DNN from the images 320 and 340 in FIG. 3A. The illustrated optical flow map 360 represents a graphical representation of vertical and horizontal disparity between the images 320 and 340. It is understood that while the optical flow map 360 is shown as a gray-scaled image, it is a color-coded image based on magnitudes and directions of the vectors, e.g., smaller vectors are lighter and the color represents the direction.

Figure 3B:
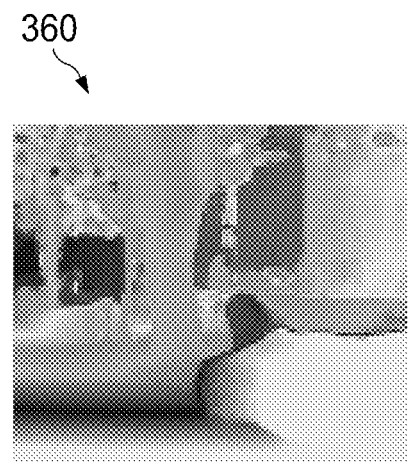

Although not explicitly shown in FIG. 3B, the generated optical flow map 360 includes for each pixel a horizontal motion vector indicating how far a given pixel moves horizontally from one image of the pair of stereoscopic images 300 to the other, and a vertical motion vector indicating how far the given pixel moves vertically from one image of the pair of stereoscopic images 300 to the other. As mentioned above, when the optical flow map 360 is generated from the stereoscopic images 300, the vertical motion vectors are generally discarded. In contrast, in accordance with embodiments of the disclosure as described with reference to method 200, the vertical motion vectors are kept and used to correct the vertical disparity between the stereoscopic images 300.

Figure 4A:
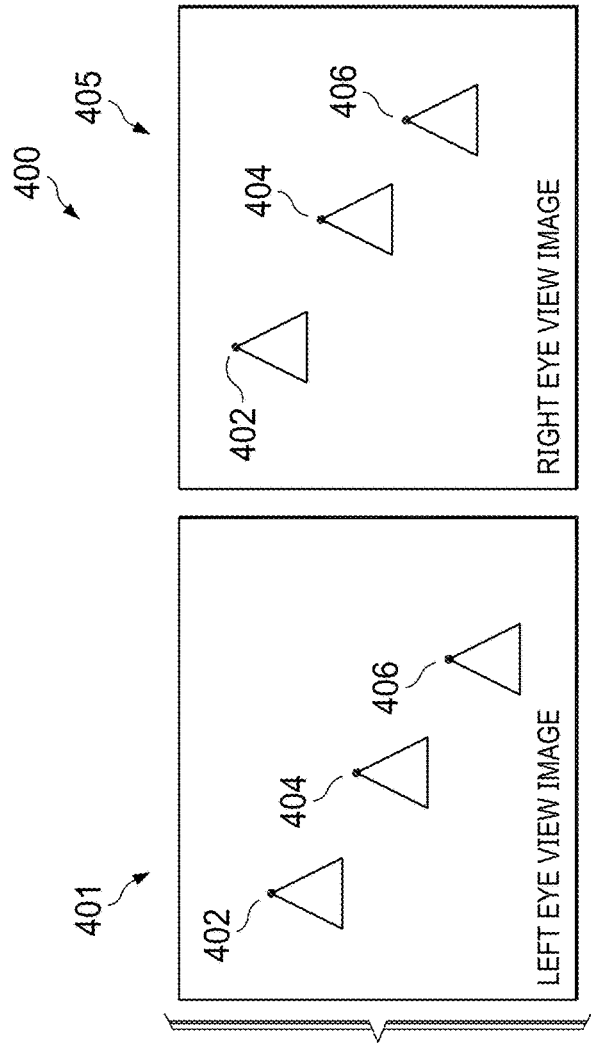
FIGS. 4A and 4B illustrate exemplary stereoscopic images and vertical and horizontal motion vectors between the exemplary stereoscopic images, respectively.
Figure 4B:
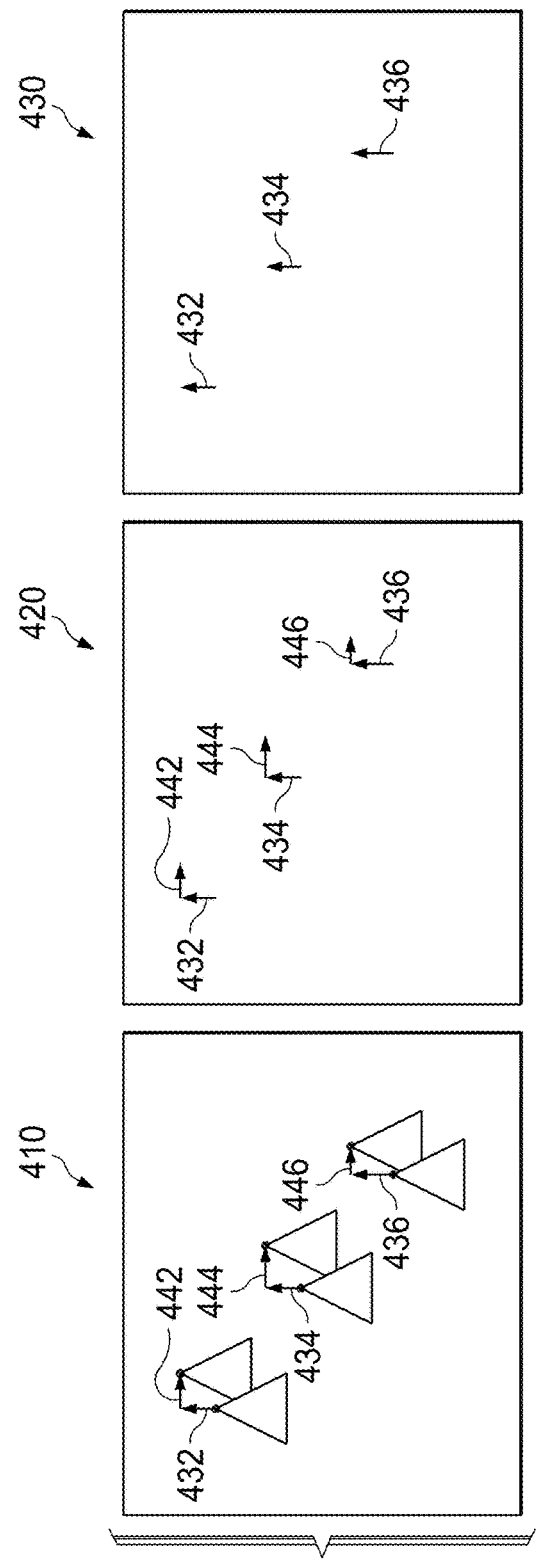

Exemplary illustrations of stereoscopic images and vertical and horizontal motion vectors between stereoscopic images are illustrated in FIGS. 4A and 4B. FIG. 4A illustrates a pair of stereoscopic images 400 that includes a left eye view image 401 and a right eye view image 405. Both the left eye view image 401 and the right eye view image 405 include pixels 402, 404, 406, that are top vertices of commonly depicted triangles in the stereoscopic pair 400.

To illustrate the movements of the pixels 402, 404, 406 from one image to the other, FIG. 4B includes representations of an overlap view 410, an optical map 420, and vertical motion vector view 430. The left and right images of the stereoscopic pair 400 are overlapped in the overlap view 410 of FIG. 4B. Horizontal arrows 432, 434, 436 represent respective horizontal motion vectors of the pixels 402, 404, 406 from the left eye image view 401 to the right eye image view 405, and vertical arrows 442, 444, 446 represent respective vertical motion vectors of the pixels 402, 404, 406 from the left eye image view 401 to the right eye image view 405. The motion vectors of the pixels 402, 404, 406 are graphically represented as respective arrows 432, 434, 436, 442, 444, 446 in the optical map 420.

Referring back to FIG. 2, the vertical motion vectors are extracted from the optical flow map at step 230. More specifically, values of the vertical motion vectors are extracted from the optical flow map generated at the step 220. In the illustrated embodiment, the optical flow map is first converted into a portable flow map that contains floating point numbers of vertical and horizontal motion vectors for each pixel in the image, and the floating point numbers are extracted as the values of the vertical motion vectors.

In another embodiment, the values of the vertical motion vectors are extracted from a vertical disparity map that has been extracted from the optical flow map. It is understood that the vertical disparity map may be calculated by either extracting the vertical motion vectors from the optical flow map or by eliminating (e.g., factoring out) horizontal motion vectors, e.g., as a horizontal disparity map, from the optical flow map. The step 230 may be performed by the processor in the system. In some embodiments where the resolution of the pair is high, e.g., HD (1920×1080) or 4K (3840×2160), the step 230 may be performed by employing the DNN.

Examples of extracted vertical motion vectors are also illustrated in FIG. 4B. The vertical motion vector view 430 shows the vertical arrows 442, 444, 446 as graphical representations of the vertical motion vectors for the pixels 402, 404, 406 that have been extracted from the optical map 420 of FIG. 4B.

At step 240, a vertical disparity between the pair of the images is determined using the vertical motion vectors. More specifically, magnitudes and locations of the vertical motion vectors are analyzed to determine and identify a pattern or trend of the vertical disparity between the pair of the images, such as a radial or directional shift or offset of pixels in a region of the image. Using the motion vectors of the pixels 402, 404, 406 in FIGS. 4A and 4B as examples, origins of the arrows 432-436 represent locations of the respective vertical motion vectors and lengths of the arrows 432-436 represent magnitudes of the respective vertical motion vectors.

At step 250, a granularity in correcting the vertical disparity between the image pair, e.g., a pixel by pixel basis and a region by region granularity, is selected based on the trend of the vertical disparity between the image pair. For example, for a certain region of the image that is radially or directionally shifted by few pixels, a region-by-region granularity may be selected for that region, whereas, for regions where no particular disparity trend/pattern is present, a pixel by pixel granularity may be selected.

In one embodiment, the source of the images being processed is considered in selecting a basis for correction. For example, for a set of images that is known to come from the same particular source, e.g., a camera rig/set, a correction basis for one pair of the image can be used for all other images in the set.

At step 260, the pair of stereoscopic images is vertically aligned based on the vertical motion vectors and the granularity. More specifically, corresponding regions or pixels of the images are first identified and then adjusted to be vertically aligned with one another based on the vertical disparity. For example, pixels in the images that depict corresponding or common features or objects of the images are moved such that vertical positions of the corresponding features match one another. In one embodiment, corresponding pixels in both images are adjusted, e.g., to meet in the middle, for vertical alignment, and in other embodiment, pixels in just one of the images are adjusted for vertical alignment. For portions of the images that do not have corresponding features, such as portions of images that depict generally uniform background, the vertical disparity pattern may be used for vertical alignment.

The method 200 ends at step 270, when the vertically aligned pair of images is displayed. The step 270 may be performed by a display, such as display 108 in FIG. 1.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein.

The digital data processors or computers can be comprised of one or more GPUs, one or more CPUs, one or more of other processor types, or a combination thereof. The digital data processors and computers can be located proximate each other, proximate a user, in a cloud environment, a data center, or located in a combination thereof. For example, some components can be located proximate the user and some components can be located in a cloud environment or data center.

The GPUs can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip.

The processors or computers can be part of GPU racks located in a data center. The GPU racks can be high-density (HD) GPU racks that include high performance GPU compute nodes and storage nodes. The high performance GPU compute nodes can be servers designed for general-purpose computing on graphics processing units (GPGPU) to accelerate deep learning applications. For example, the GPU compute nodes can be servers of the DGX product line from Nvidia Corporation of Santa Clara, Calif.

The compute density provided by the HD GPU racks is advantageous for AI computing and GPU data centers directed to AI computing. The HD GPU racks can be used with reactive machines, autonomous machines, self-aware machines, and self-learning machines that all require a massive compute intensive server infrastructure. For example, the GPU data centers employing HD GPU racks can provide the storage and networking needed to support large-scale deep neural network (DNN) training, such as for the DNNs disclosed herein.

The DNNs disclosed herein include multiple layers of connected nodes that can be trained with input data to solve complex problems. For example, pairs of stereoscopic images can be used as input data for training of the DNN. Once the DNNs are trained, the DNNs can be deployed and used to generate optical flow maps.

During training, data flows through the DNNs in a forward propagation phase until a prediction is produced that indicates a label corresponding to the input. When the DNNs do not correctly label the input, errors between the correct label and the predicted label are analyzed, and the weights are adjusted for features of the layers during a backward propagation phase that correctly labels the inputs in a training dataset. With thousands of processing cores that are optimized for matrix math operations, GPUs such as noted above are capable of delivering the performance required for training DNNs for artificial intelligence and machine learning applications.

Portions of disclosed embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

It is noted that as used herein and in the appended claims, the singular forms "a", "an", and "the" include plural referents unless the context clearly dictates otherwise.

What is claimed is:

1. A method for displaying images, comprising:
   generating an optical flow map of a pair of stereoscopic images, the optical flow map including vertical motion vectors;
   determining a vertical disparity between the pair of stereoscopic images based on the vertical motion vectors, wherein the determining the vertical disparity includes:
      converting the optical flow map into a portable flow map that contains floating point numbers of the vertical motion vectors; and
      extracting the floating numbers as values of the vertical motion vectors; and
   based on the vertical disparity, vertically aligning the pair of stereoscopic images at a selected level of granularity to produce a vertically aligned pair of stereoscopic images.

2. The method of claim 1, wherein the optical flow map is generated using a deep neural network that is trained to produce optical flow maps from pairs of stereoscopic images.

3. The method of claim 1, wherein the determining the vertical disparity includes analyzing magnitudes and locations of the vertical motion vectors to determine a pattern of the vertical disparity.

4. The method of claim 1, further comprising displaying the vertically aligned pair of stereoscopic images in a display device.

5. The method of claim 1, wherein the optical flow map has a resolution equivalent to a resolution of each image in the pair of stereoscopic images.

6. The method of claim 1, wherein the vertically aligning includes:
   identifying one or more pixels of a first image of the pair of stereoscopic images corresponding to one or more pixels of a second image of the pair of stereoscopic images; and
   adjusting, based on the vertical disparity, a position of at least one of: the one or more pixels of the first image or the one or more pixels of the second image such that the one or more pixels of the first image are vertically aligned with the one or more pixels of the second image.

7. A system for displaying a pair images, comprising:
an interface to receive a pair of stereoscopic images from an image source; and
a processor to:
  generate an optical flow map based on the pair of stereoscopic images using a deep neural network (DNN), the optical flow map including vertical motion vectors;
  convert the optical flow map into a portable flow map that contains floating point numbers of the vertical motion vectors;
  extract the floating numbers as values of the vertical motion vectors;
  determine a vertical disparity between the pair of stereoscopic images based on the vertical motion vectors; and
  based on the vertical disparity, vertically align the pair of stereoscopic images at a selected level of granularity to produce a vertically aligned pair of stereoscopic images.

8. The system of claim 7, wherein the DNN is trained to produce optical flow maps from pairs of stereoscopic images.

9. The system of claim 7, wherein a pattern of the vertical disparity is determined based on an analysis of magnitudes and locations of the vertical motion vectors.

10. The system of claim 7, further comprising a display to display the vertically aligned pair of stereoscopic images.

11. The system of claim 7, wherein the processor is further to generate a vertical disparity map of the pair of stereoscopic images using the DNN.

12. The system of claim 7, wherein the processor is further to vertically align the pair of stereoscopic images by adjusting one or more positions of one or more pixels in a first image of the stereoscopic images to be vertically aligned with one or more pixels in a second image of the stereoscopic images corresponding to the one or more pixels in the first image based on the vertical disparity.

13. A computer program product having a series of instructions stored on a non-transitory computer-readable medium that configures a processor, when executed thereby, to perform operations comprising:
  generating an optical flow map of based on a pair of stereoscopic images, the optical flow map including vertical motion vectors;
  determining a vertical disparity between the pair of stereoscopic images based on the vertical motion vectors, wherein the operation for determining the vertical disparity further includes:
    converting the optical flow map into a portable flow map that contains floating point numbers of the vertical motion vectors; and
    extracting the floating numbers as values of the vertical motion vectors; and
  based on the vertical disparity, vertically aligning the pair of stereoscopic images at a selected level of granularity to produce a vertically aligned pair of stereoscopic images.

14. The product of claim 13, wherein the optical flow map is generated using a deep neural network that is trained to produce optical flow maps from pairs of stereoscopic images.

15. The product of claim 13, wherein the operations for determining the vertical disparity includes analyzing magnitudes and locations of the vertical motion vectors to determine a pattern of the vertical disparity.

16. The product of claim 13, wherein the operations for vertically aligning include: identifying one or more pixels of a first image of the pair of stereoscopic images corresponding to one or more pixels of a second image of the pair of stereoscopic images; and
  adjusting, based on the vertical disparity, a position of at least one of: the one or more pixels of the first image or the one or more pixels of the second image such that the one or more pixels of the first image are vertically aligned with the one or more pixels of the second image.

* * * * *